US 10,148,052 B2

United States Patent
Kato

(10) Patent No.: US 10,148,052 B2
(45) Date of Patent: Dec. 4, 2018

(54) CONNECTING-AND-FIXING METHOD FOR CABLE

(71) Applicant: Murata Manufacturing Co., Ltd., Nagaokakyo-shi, Kyoto-fu (JP)

(72) Inventor: Noboru Kato, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 882 days.

(21) Appl. No.: 14/562,795

(22) Filed: Dec. 8, 2014

(65) Prior Publication Data

US 2015/0082629 A1 Mar. 26, 2015

Related U.S. Application Data

(63) Continuation of application No. PCT/JP2013/066146, filed on Jun. 12, 2013.

(30) Foreign Application Priority Data

Jun. 29, 2012 (JP) .................................. 2012-146426

(51) Int. Cl.
*H01R 43/02* (2006.01)
*H01R 12/62* (2011.01)
(Continued)

(52) U.S. Cl.
CPC ............. *H01R 43/02* (2013.01); *H01R 12/62* (2013.01); *H05K 1/148* (2013.01); *H05K 3/361* (2013.01);
(Continued)

(58) Field of Classification Search
CPC ...... H01R 43/02; H05K 1/148; H05K 1/0221; H05K 3/361; Y10T 29/49179
(Continued)

(56) References Cited

U.S. PATENT DOCUMENTS

2012/0114340 A1 5/2012 Sugiyama

FOREIGN PATENT DOCUMENTS

| JP | 63-109382 U | 7/1988 |
| JP | 2006-100566 A | 4/2006 |

(Continued)

OTHER PUBLICATIONS

Official Communication issued in International Patent Application No. PCT/JP2013/066146, dated Sep. 17, 2013.

*Primary Examiner* — Peter DungBa Vo
*Assistant Examiner* — Azm Parvez
(74) *Attorney, Agent, or Firm* — Keating & Bennett, LLP

(57) ABSTRACT

A high-frequency transmission line includes an insulator as a base material, and also includes linear conductors configured to transmit signals. Through holes are provided at positions corresponding to the positions of the linear conductors. The high-frequency transmission line is arranged on a connector in a state in which the positions of the bottom ends of the through holes are respectively aligned with the positions of signal terminals provided on the connector. A conductive bonding material provided at the top ends of the through holes is fluidized when heat is applied thereto, and flows to the bottom ends of the through holes due to surface tension or capillarity. As a result, the linear conductors are electrically connected to the signal terminals respectively.

15 Claims, 16 Drawing Sheets

(51) Int. Cl.
*H05K 1/14* (2006.01)
*H05K 3/36* (2006.01)
*H05K 1/02* (2006.01)

(52) U.S. Cl.
CPC ....... *H05K 1/0221* (2013.01); *Y10T 29/49179* (2015.01)

(58) Field of Classification Search
USPC .............................. 29/860, 857, 825, 592.1
See application file for complete search history.

(56) References Cited

FOREIGN PATENT DOCUMENTS

| JP | 2006100566 A | * | 4/2006 |
| JP | 2011-071403 A | | 4/2011 |
| JP | 2011071403 A | * | 4/2011 |
| JP | 2012-105104 A | | 5/2012 |

* cited by examiner

SECTIONAL VIEW ALONG LINE A-A

SECTIONAL VIEW ALONG LINE B-B

SECTIONAL VIEW ALONG LINE C-C

SECTIONAL VIEW ALONG LINE D-D

SECTIONAL VIEW ALONG LINE F-F

SECTIONAL VIEW ALONG LINE G-G

SECTIONAL VIEW ALONG LINE H-H

SECTIONAL VIEW ALONG LINE H-H

US 10,148,052 B2

CONNECTING-AND-FIXING METHOD FOR CABLE

BACKGROUND OF THE INVENTION

1. Field of the Invention

The present invention relates to connecting-and-fixing methods for cables, and more particularly, to a connecting-and-fixing method for fixing a cable to a substrate in a state in which a linear conductor provided in the cable is electrically connected to a terminal on the substrate.

2. Description of the Related Art

Coaxial cables are a typical example of high-frequency transmission lines for connecting high-frequency circuits and high-frequency elements. Coaxial cables include a central conductor (signal line conductor) and a shield conductor provided around the central conductor. Since coaxial cables are resistant to bending and deformation and are inexpensive, coaxial cables are widely used in various types of high-frequency electronic devices.

In recent years, functionality of high-frequency electronic devices, such as mobile communication terminals, has been increased and the size of high-frequency electronic devices has been reduced. As a result, it has become difficult to provide a sufficient space for coaxial cables in a terminal housing. Accordingly, as disclosed in, for example, Japanese Unexamined Patent Application Publication No. 2011-71403, tri-plate flat cables, which are formed by stacking thin base sheets together, may be used. Flat cables have a thin plate-shaped structure in which a signal line conductor is sandwiched between two ground conductors. Although flat cables are somewhat wider than coaxial cables, the thickness thereof can be made smaller than that of coaxial cables. Therefore, flat cables are useful in a case where only thin gaps are provided in a terminal housing.

In the case where a flat cable is used to connect, for example, an antenna device to a feeding circuit, connectors are used to establish the connection. More specifically, a male connector provided at an end of the cable is fitted to a female connector connected to an end of the antenna device, while a male connector provided at the other end of the cable is fitted to a female connector connected to the feeding circuit. Thus, the antenna element and the feeding circuit can be connected to each other with the flat cable.

However, the male and female connectors are formed by, for example, bending a thin metal plate and molding the thin metal plate with resin, and require a complex manufacturing process. Therefore, high-accuracy small male and female connectors are difficult to produce and are expensive. Also, a mounting process for mounting the connectors to the flat cable needs to be performed, and it becomes more difficult to reduce variations in positional accuracy as the size of the connectors decreases.

SUMMARY OF THE INVENTION

Accordingly, preferred embodiments of the present invention provide a connecting-and-fixing method for a cable with which a reliable connection structure is established by a simple process.

A connecting-and-fixing method for a cable according to a preferred embodiment of the present invention includes a first step of preparing a cable including a linear conductor that is provided in or on an insulating base material, the base material including a through hole at a position corresponding to a position of the linear conductor; a second step of placing the cable on a substrate in a state in which a position of an end of the through hole is aligned with a position of a substrate terminal provided on the substrate; and a third step of fluidizing a conductive bonding material applied to the other end of the through hole and causing the conductive bonding material to flow through the through hole to the one end of the through hole to electrically connect the linear conductor to the terminal.

Preferably, a metal film is provided on an inner peripheral surface of the through hole.

Preferably, a metal film is disposed around the one end and/or the other end of the through hole.

Preferably, the substrate terminal is provided on a connection member mounted on the substrate.

Preferably, the linear conductor includes a signal conductor to which a signal voltage is applied and a ground conductor to which a ground voltage is applied, and the substrate terminal includes a signal terminal connected to a signal line and a ground terminal connected to a ground.

The linear conductor provided in the base material is exposed at an inner peripheral surface of the through hole. The conductive bonding material provided at the other end of the through hole is fluidized after the cable is arranged on the substrate in a state in which the one end of the through hole is positioned with respect to the substrate terminal. The fluidized conductive bonding material flows to the one end of the through hole, so that the linear conductor and the substrate terminal are electrically connected to each other. Thus, a reliable connection structure is established by a simple process.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
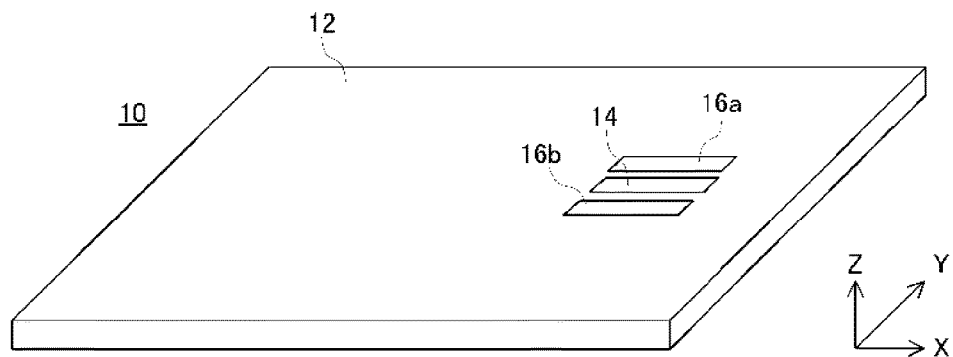
FIG. 1 is a perspective view of a printed wiring board according to a preferred embodiment of the present invention.

Referring to FIG. 1, a printed wiring board 10 according to a preferred embodiment of the present invention includes an insulating (dielectric) wiring substrate 12 having rectangular or substantially rectangular top and bottom surfaces. The long and short sides of the rectangular or substantially rectangular top and bottom surfaces of the wiring substrate 12 extend along an X-axis and a Y-axis, respectively, and the wiring substrate 12 has a thickness along a Z-axis.

A wiring conductor and a ground conductor (neither is shown) are embedded in the wiring substrate 12. A single signal terminal 14, which is electrically connected to the wiring conductor, and two ground terminals 16a and 16b, which are electrically coupled to the ground conductor, are provided on the top surface of the wiring substrate 12. Each of the signal terminal 14 and the ground terminals 16a and 16b preferably is plate-shaped and has rectangular or substantially rectangular top and bottom surfaces.

The signal terminal 14 and the ground terminals 16a and 16b are disposed at predetermined positions on the top surface of the wiring substrate 12 such that the long sides of the rectangular or substantially rectangular top and bottom surfaces thereof extend along the X-axis, and the signal terminal 14 is disposed between the ground terminals 16a and 16b in the Y-axis direction.

Figure 2A:
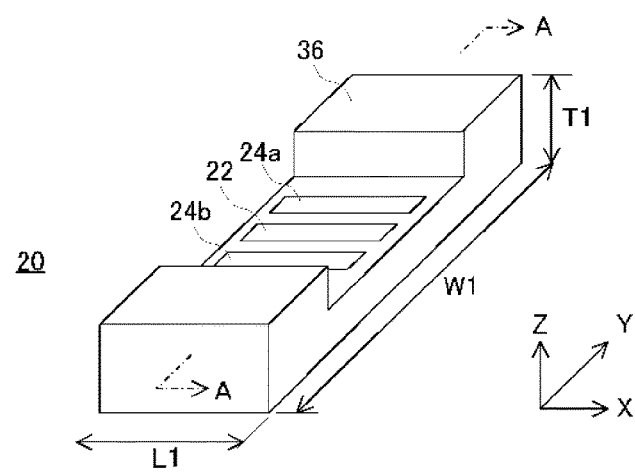
FIG. 2A is a perspective view of a guide member according to a preferred embodiment of the present invention.
Figure 2B:
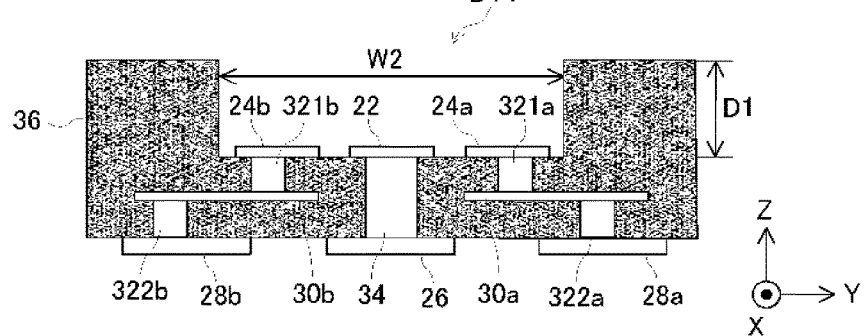
FIG. 2B is a sectional view of the guide member illustrated in FIG. 2A taken along line A-A.

Referring to FIGS. 2A and 2B, a guide member 20 includes an insulator (dielectric) 36 defining a base body, and has a length L1 along the X-axis, a width W1 along the Y-axis, and a thickness T1 along the Z-axis. A recess DT1 is provided in a central region of the top surface of the insulator 36. The recess DT1 has the length L1 along the X-axis, a width W2 along the Y-axis, and a depth D1 along the Z-axis. The width W2 is smaller than the width W1, and the depth D1 is smaller than the thickness T1. A single signal terminal 22 and two ground terminals 24a and 24b are provided on a bottom surface of the recess DT1, that is, on a flat surface formed a height corresponding to "T1−D1".

Each of the signal terminal 22 and the ground terminals 24a and 24b preferably is plate-shaped and has rectangular or substantially rectangular top and bottom surfaces. The signal terminal 22 and the ground terminals 24a and 24b are disposed on the bottom surface of the recess DT1 such that the long sides of the rectangular or substantially rectangular top and bottom surfaces thereof extend along the X-axis, and the signal terminal 22 is disposed between the ground terminals 24a and 24b in the Y-axis direction.

The lengths of the short sides of the rectangular or substantially rectangular top and bottom surfaces of the signal terminal 22 and the ground terminals 24a and 24b are much smaller than "W2", which is the width of the recess DT1, and the sum thereof is also smaller than the width W2. Therefore, the signal terminal 22 and the ground terminals 24a and 24b are provided on the bottom surface of the recess DT1 without contacting each other.

A single signal terminal 26 and two ground terminals 28a and 28b are provided on the bottom surface of the insulator 36. Each of the signal terminal 26 and the ground terminals 28a and 28b preferably is also plate-shaped and has rectangular or substantially rectangular top and bottom surfaces. The signal terminal 26 is disposed directly below the signal terminal 22. The ground terminal 28a is shifted in the positive Y-axis direction from a position directly below the ground terminal 24a, and the ground terminal 28b is shifted in the negative Y-axis direction from a position directly below the ground terminal 24b.

The insulator 36 is formed by stacking a plurality of insulation sheets together, and plate-shaped conductors 30a and 30b are embedded in the insulator 36. The plate-shaped conductor 30a is embedded at a position where the plate-shaped conductor 30a partially overlaps the ground terminals 24a and 28a when viewed in the Z-axis direction. The plate-shaped conductor 30b is embedded at a position where the plate-shaped conductor 30b partially overlaps the ground terminals 24b and 28b when viewed in the Z-axis direction.

The signal terminals 22 and 26 are connected to each other by a via-hole conductor 34. The ground terminal 24a is connected to the plate-shaped conductor 30a by a via-hole conductor 321a, and the plate-shaped conductor 30a is connected to the ground terminal 28a by a via-hole conductor 322a. The ground terminal 24b is connected to the plate-shaped conductor 30b by a via-hole conductor 321b, and the plate-shaped conductor 30b is connected to the ground terminal 28b by a via-hole conductor 322b.

Figure 3A:
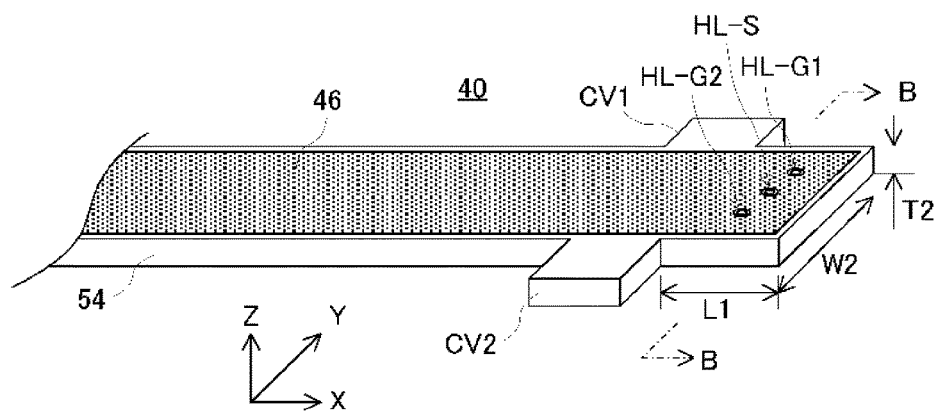
FIG. 3A is a perspective view of a high-frequency transmission line according to a preferred embodiment of the present invention viewed obliquely from above.
Figure 3B:
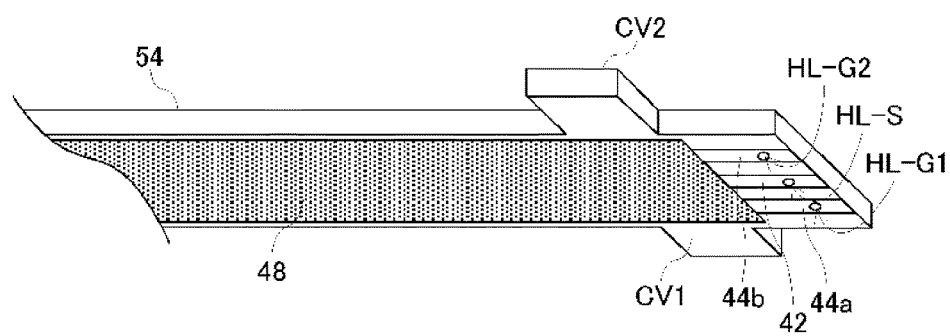
FIG. 3B is a perspective view of the high-frequency transmission line according to the present preferred embodiment viewed obliquely from below.

Referring to FIGS. 3A and 3B, a high-frequency transmission line (flat cable) 40 includes a flexible thin plate-shaped insulator (dielectric) 54 defining a base body, and has a certain length along the X-axis, the width W2 along the Y-axis, and a thickness T2 along the Z-axis. The thickness T2 is slightly smaller than the above-described depth D1.

A resist layer 46, which has the same or substantially the same width as the width W2 and extends in the X-axis, is provided on the top surface of the insulator 54. A resist layer 48, which has the same or substantially the same width as the width W2 and extends in the X-axis, is provided on the bottom surface of the insulator 54. The resist layer 46 extends to the end portion of the insulator 54 in the positive X-axis direction, whereas the resist layer 48 extends only to a position in front of the end portion of the insulator 54 in the positive X-axis direction. Therefore, the bottom surface of the insulator 54 is exposed in a region between the end portion of the resist layer 48 in the positive X-axis direction and the end portion of the insulator 54 in the positive X-axis direction.

A signal terminal 42 and ground terminals 44a and 44b are disposed in the exposed region. Each of the signal terminal 42 and the ground terminals 44a and 44b preferably is also plate-shaped and has rectangular or substantially rectangular top and bottom surfaces. The signal terminal 42 and the ground terminals 44a and 44b are disposed in the exposed region such that the long sides of the rectangular or substantially rectangular top and bottom surfaces thereof extend along the X-axis, and the signal terminal 42 is disposed between the ground terminals 44a and 44b in the Y-axis direction.

Three through holes HL-S, HL-G1, and HL-G2, which extend to the top surface of the high-frequency transmission line 40, are provided in the exposed region. The through hole HL-S extends through the signal terminal 42, the through hole HL-G1 extends through the ground terminal 44a, and the through hole HL-G2 extends through the ground terminal 44b. The through holes HL-S, HL-G1, and HL-G2 will be described in detail below.

A plate-shaped projection CV1 that projects from a side surface of the insulator 54 in the positive Y-axis direction and a plate-shaped projection CV2 that projects from a side surface of the insulator 54 in the negative Y-axis direction are provided near the end portion of the insulator 54 in the positive X-axis direction. The projections CV1 and CV2 are flexible insulators (dielectrics), and preferably are formed integrally with the insulator 54.

Each of the projections CV1 and CV2 preferably has rectangular or substantially rectangular top and bottom surfaces, and the short sides of the rectangular or substantially rectangular top and bottom surfaces extend in the X-axis direction or the Y-axis direction. The projections CV1 and CV2 have a thickness that corresponds to "T2". The top surfaces of the projections CV1 and CV2 are flush with the top surface of the insulator 54, and the bottom surfaces of the projections CV1 and CV2 are flush with the bottom surface of the insulator 54.

The distance between the side surface of the projection CV1 in the positive X-axis direction and the side surface of the insulator 54 in the positive X-axis direction corresponds to "L1". The distance between the side surface of the projection CV2 in the positive X-axis direction and the side surface of the insulator 54 in the positive X-axis direction also corresponds to "L1".

Figure 5:
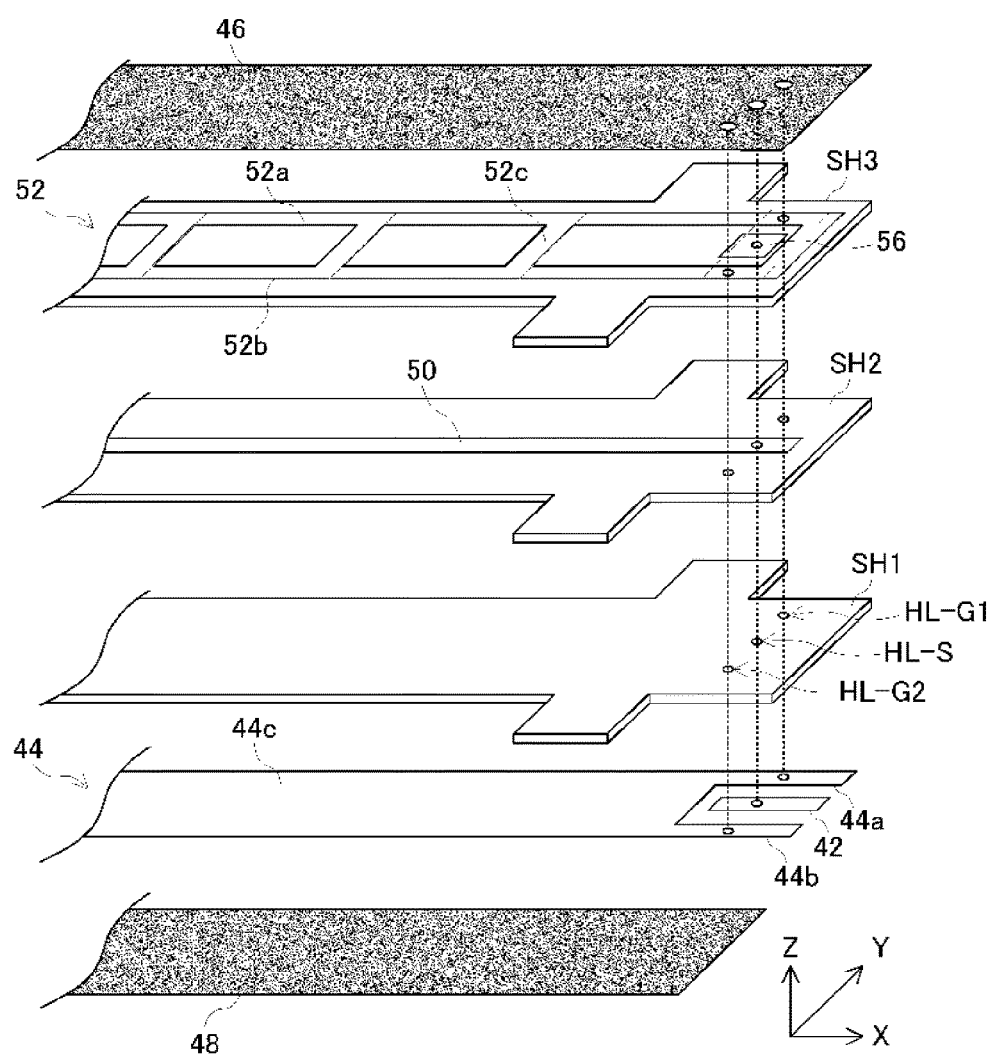
FIG. 5 is an exploded perspective view illustrating an example of a state in which the high-frequency transmission line illustrated in FIGS. 3A and 3B is disassembled.

FIG. 5 is an exploded perspective view of the high-frequency transmission line 40. The insulator 54 and the projections CV1 and CV2 are preferably formed by stacking a plurality of flexible insulation sheets (dielectric sheets) SH1 to SH3 together. The insulation sheets SH1 to SH3 have the same size, and the top and bottom surfaces of each sheet preferably are substantially cross shaped. A ground layer 44 is formed on the bottom surface of the insulation sheet SH1. A linear conductor 50 configured to transmit signals is formed on the top surface of the insulation sheet SH2. A ground layer 52 and a reinforcing layer 56 are formed on the top surface of the insulation sheet SH3.

The ground layer 44 has an integral structure including the above-described ground terminals 44a and 44b and a plate-shaped ground conductor 44c having rectangular or substantially rectangular top and bottom surfaces. The thickness of the ground conductor 44c in the Z-axis direction is the same or substantially the same as the thickness of each of the ground terminals 44a and 44b in the Z-axis direction. The top surface of the ground conductor 44c is flush with the top surfaces of the ground terminals 44a and 44b, and the bottom surface of the ground conductor 44c is flush with the bottom surfaces of the ground terminals 44a and 44b. The ground conductor 44c is entirely covered by the resist layer 48, and the ground terminals 44a and 44b are partially covered by the resist layer 48.

The linear conductor 50 has a width that is much smaller than the width W2 illustrated in FIG. 3A, and extends in the X-axis direction in a central region of the top surface of the insulation sheet SH2 in the Y-axis direction. An end portion of the linear conductor 50 is electrically connected to the signal terminal 42 with a conductor (not shown).

The ground layer 52 includes two linear conductors 52a and 52b, which have a width that is much smaller than the width W2 and extend in the X-axis direction, and a plurality of linear conductors 52c, 52c, . . . , which extend in the Y-axis direction and which are connected to the linear conductors 52a and 52b. In other words, the ground layer 52 has a structure in which opening portions and bridge portions are alternately arranged along the linear conductor 50. The linear conductors 52a, 52b and 52c have the same thickness, and include top surfaces that flush with each other and bottom surfaces that also flush with each other.

The reinforcing layer 56 is plate shaped, and has rectangular or substantially rectangular principal surfaces. The reinforcing layer 56 is provided on an end portion of the insulation sheet SH2 such that the reinforcing layer 56 is not in contact with the ground layer 52. The ground layer 52 and reinforcing layer 56 are entirely covered by the resist layer 46.

Figure 4:
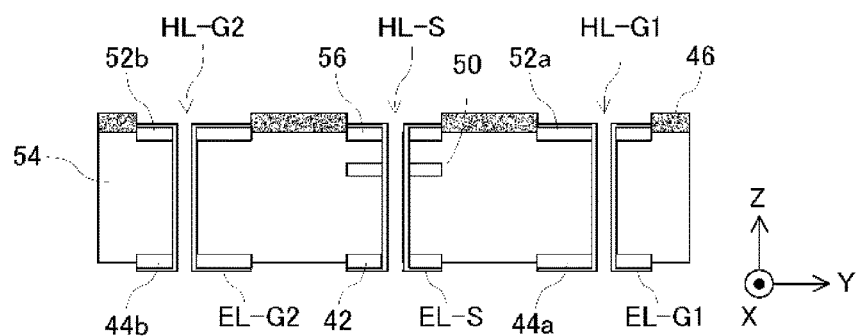
FIG. 4 is a sectional view of the high-frequency transmission line illustrated in FIGS. 3A and 3B taken along line B-B.

The high-frequency transmission line 40 preferably is formed by stacking the above-described elements and bonding them together by thermocompression. As illustrated in FIG. 4, in a cross section of an end portion of the manufactured high-frequency transmission line 40 along a plane orthogonal to the X-axis, the linear conductor 50 is offset toward the ground layer 52.

As is clear from FIG. 4, the linear conductor 50 and the reinforcing layer 56 are located directly above the signal terminal 42. Similarly, the linear conductor 52a is located directly above the ground terminal 44a, and the linear conductor 52b is located directly above the ground terminal 44b. Therefore, the through hole HL-S extends not only through the signal terminal 42 but also through the linear conductor 50 and reinforcing layer 56, the through hole HL-G1 extends not only through the ground terminal 44a but also through the linear conductor 52a, and the through hole HL-G2 extends not only through the ground terminal 44b but also through the linear conductor 52b.

A conductive film EL-S is formed on the inner peripheral surface of the through hole HL-S, a conductive film EL-G1 on the inner peripheral surface of the through hole HL-G1, and a conductive film EL-G2 on the inner peripheral surface of the through hole HL-G2. The reinforcing layer 56, the linear conductor 50, and the signal terminal 42 are connected to each other by the conductive film EL-S. The linear conductor 52a and the ground terminal 44a are connected to each other by the conductive film EL-G1. The linear conductor 52b and the ground terminal 44b are connected to each other by the conductive film EL-G2.

The inner diameter of each of the through holes HL-S, HL-G1, and HL-G2 is slightly larger in the resist layer 46 than in the insulator 54, and the reinforcing layer 56 and the linear conductors 52a and 52b are exposed at the top surface of the insulator 54 in regions corresponding to the difference in inner diameter. The signal terminal 42 and the ground terminals 44a and 44b are exposed at the bottom surface of the insulator 54.

The conductive films EL-S, EL-G1, and EL-G2 cover the reinforcing layer 56 and the linear conductors 52a and 52b exposed at the top surface of the insulator 54, and partially cover the signal terminal 42 and the ground terminals 44a and 44b exposed at the bottom surface of the insulator 54.

Figure 6A:
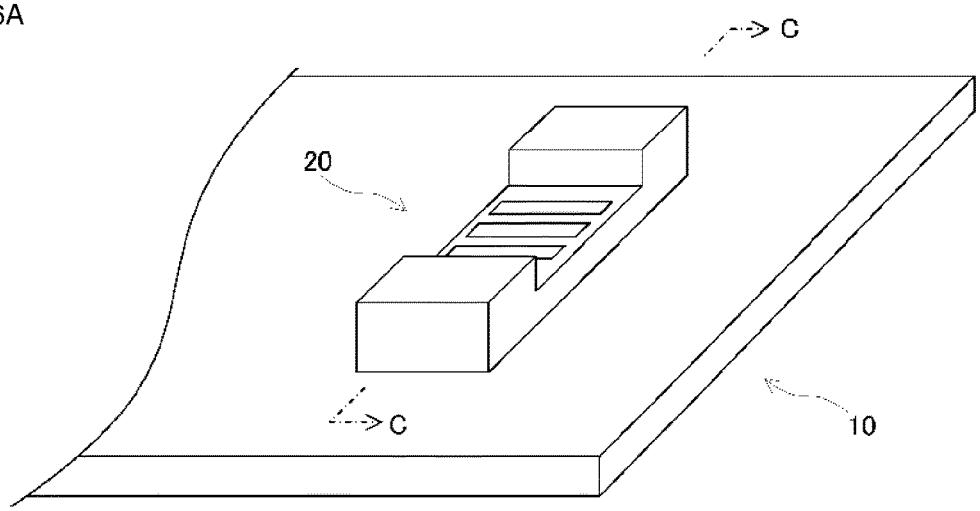
FIG. 6A is a perspective view illustrating an example of a state in which the guide member is mounted on the printed wiring board.
Figure 6B:
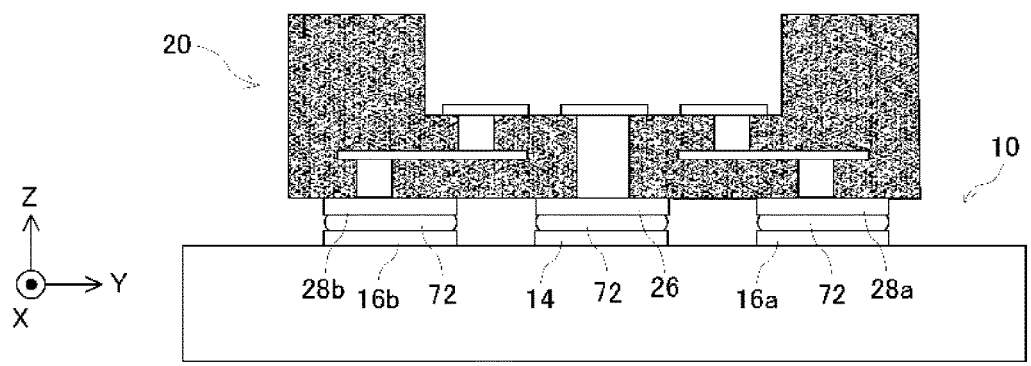
FIG. 6B is a sectional view of the mounting structure illustrated in FIG. 6A taken along line C-C.

The guide member 20 is mounted on the printed wiring board 10 in a manner illustrated in FIGS. 6A and 6B, and the high-frequency transmission line 40 is fixed to the guide member 20 in a manner illustrated in FIGS. 7A, 7B, 8A, and 8B.

Referring to FIGS. 6A and 6B, the guide member 20 is fixed to the printed wiring board 10 with a conductive bonding material 72, such as solder paste, at a position corresponding to the positions of the signal terminal 14 and the ground terminals 16a and 16b provided on the printed wiring board 10. As a result, the signal terminal 26 and the ground terminals 28a and 28b provided on the guide member 20 are respectively connected to the signal terminal 14 and the ground terminals 16a and 16b provided on the printed wiring board 10.

Figure 7A:
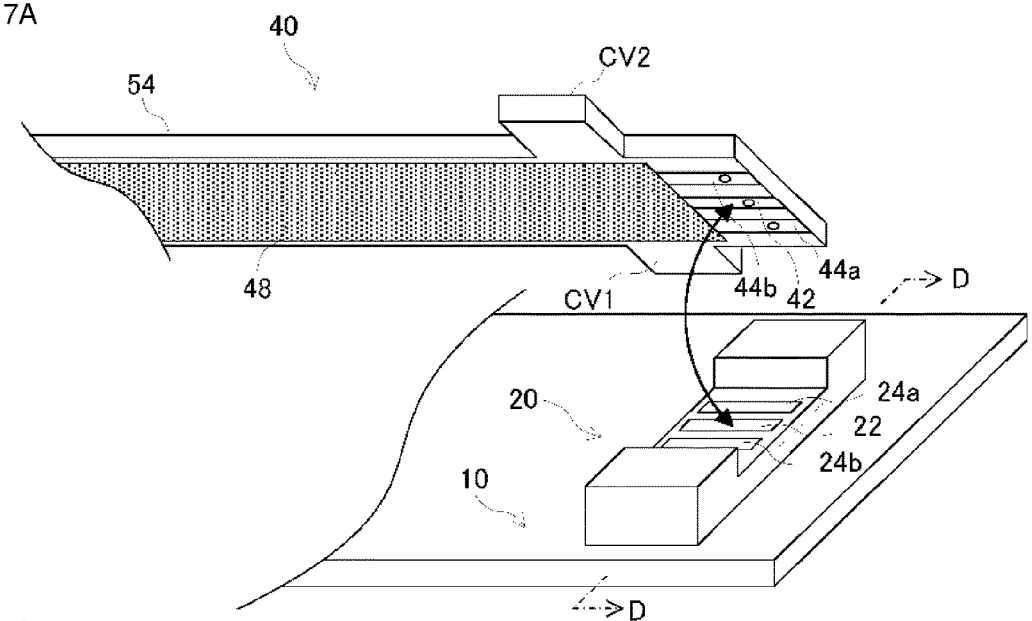
FIG. 7A is a diagram illustrating a step of a process of attaching the high-frequency transmission line to the guide member.
Figure 7B:
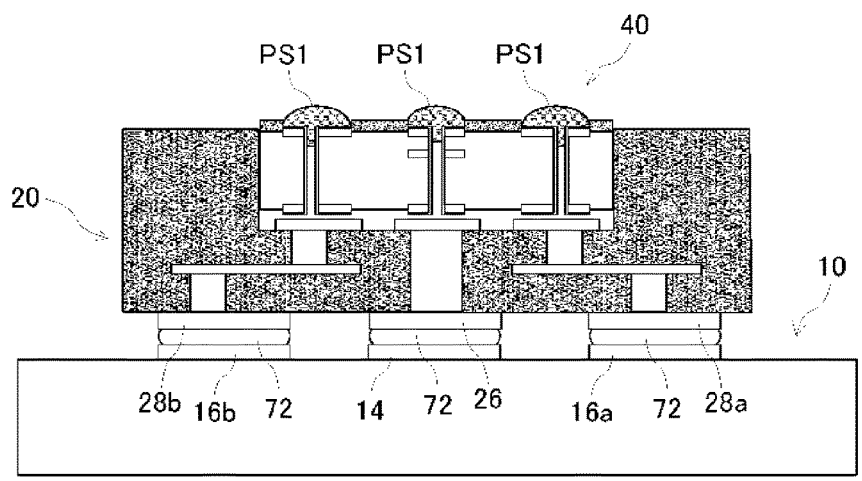
FIG. 7B is a sectional view of the structure illustrated in FIG. 7A taken along line D-D.

Referring to FIGS. 7A and 7B, the end portion of the high-frequency transmission line 40 is fitted to the recess DT1 in the guide member 20. The projections CV1 and CV2 provided on the high-frequency transmission line 40 engage with the insulator 36 of the guide member 20 so that the high-frequency transmission line 40 and the guide member 20 are positioned relative to each other. More specifically, the side surfaces of the projections CV1 and CV2 in the positive X-axis direction are brought into contact with the side surface of the insulator 36 in the negative X-axis direction. As a result, the signal terminal 42 and the ground terminals 44a and 44b provided on the high-frequency transmission line 40 are respectively connected to the signal terminal 22 and the ground terminals 24a and 24b provided on the guide member 20.

Figure 8A:
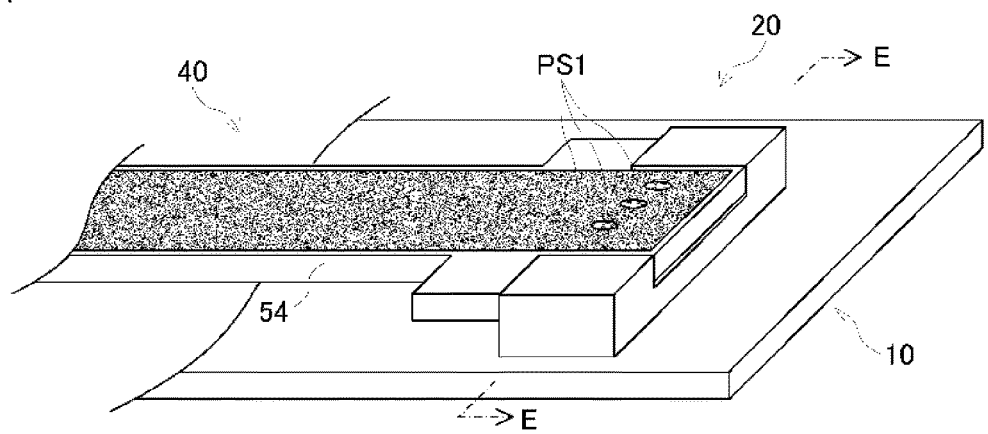
FIG. 8A is a diagram illustrating another step of the process of attaching the high-frequency transmission line to the guide member.
Figure 8B:
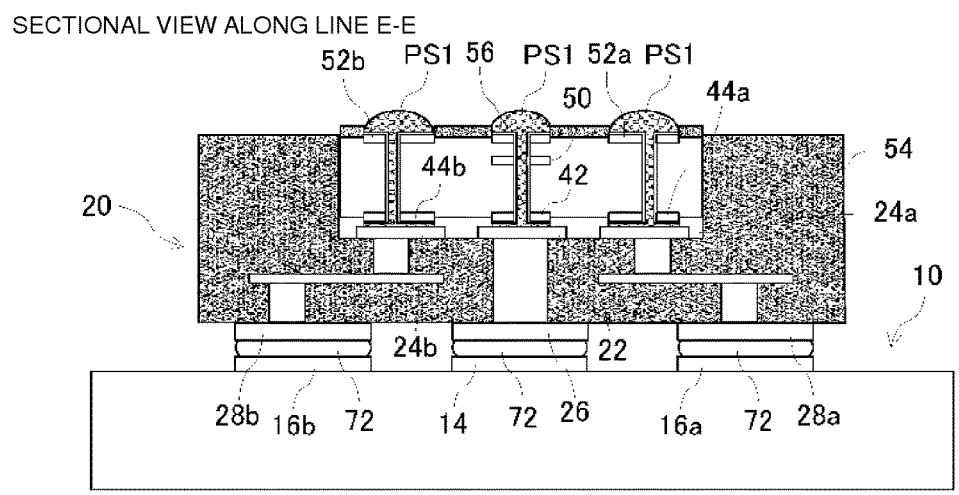
FIG. 8B is a sectional view of the structure illustrated in FIG. 8A taken along line E-E.

A conductive bonding material PS1, such as solder paste, is printed on the top-surface-side end portions of the through holes HL-S, HL-G1, and HL-G2. When the high-frequency transmission line 40 is heated after the printing process, the conductive bonding material PS1 is melted. The melted conductive bonding material PS1 flows to the bottom-surface-side end portions of the through holes HL-S, HL-G1, and HL-G2 due to surface tension or capillarity. As a result, as illustrated in FIGS. 8A and 8B, the reinforcing layer 56, the linear conductor 50, and the signal terminal 42 are connected to the signal terminal 22, the linear conductor 52a and the ground terminal 44a to the ground terminal 24a, and the linear conductor 52b and the ground terminal 44b to the ground terminal 24b.

Figure 9A:
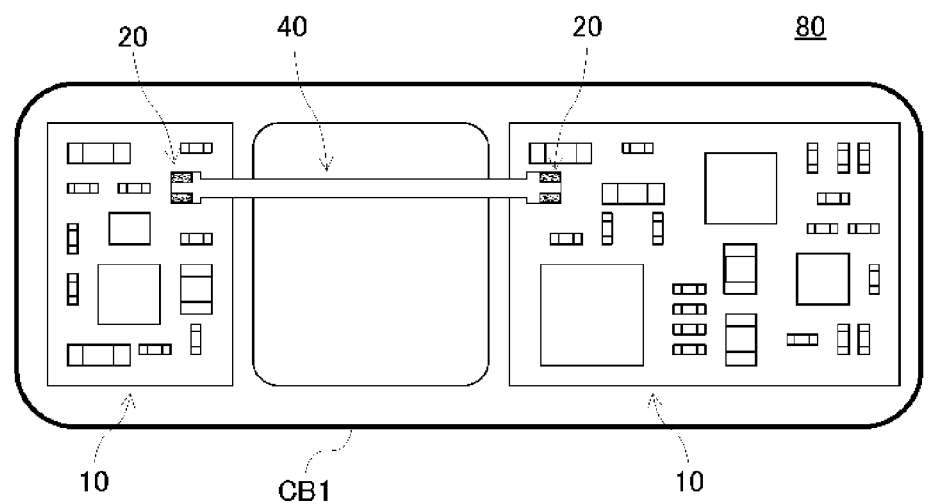
FIG. 9A is a top view of an example of a mobile communication terminal including the high-frequency transmission line, guide members, and printed wiring boards according to a preferred embodiment of the present invention.
Figure 9B:
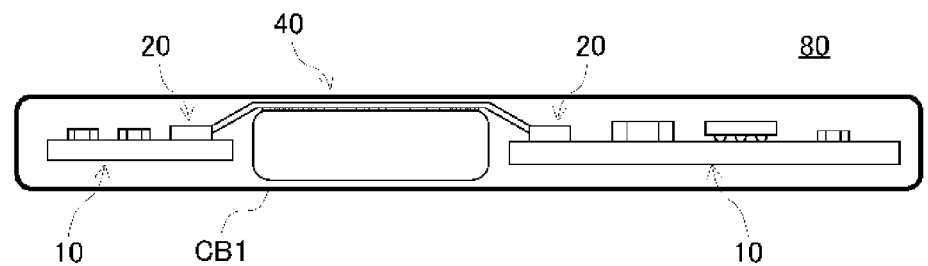
FIG. 9B is a sectional view of a main portion of the communication terminal illustrated in FIG. 9A.

As illustrated in FIGS. 9A and 9B, printed wiring boards 10 on which guide members 20 are mounted are housed in, for example, a housing CB1 of a mobile communication terminal 80. The high-frequency transmission line 40 is mounted on the printed wiring boards 10 in the above-described manner. Accordingly, circuits or elements mounted on the printed wiring boards 10 are connected to each other by the high-frequency transmission line 40. The high-frequency transmission line 40 is thin and flexible, and is therefore useful in a case where only a thin gap can be provided in the housing CB1.

Figure 10A:
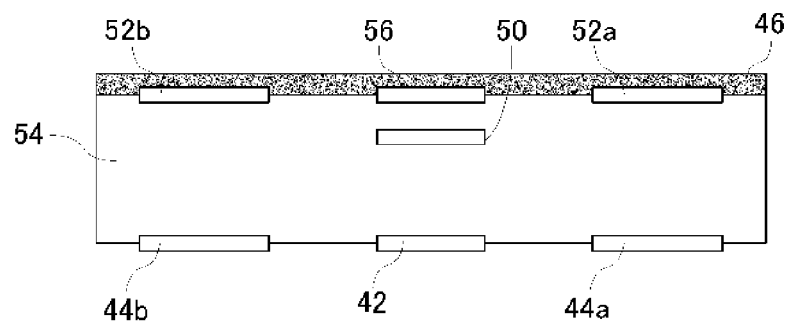
FIG. 10A is a diagram illustrating a step of a manufacturing process of the high-frequency transmission line.
Figure 10B:
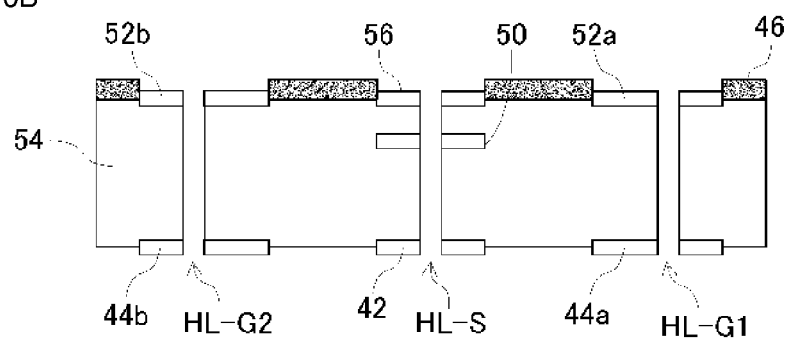
FIG. 10B is a diagram illustrating another step of the manufacturing process of the high-frequency transmission line.
Figure 10C:
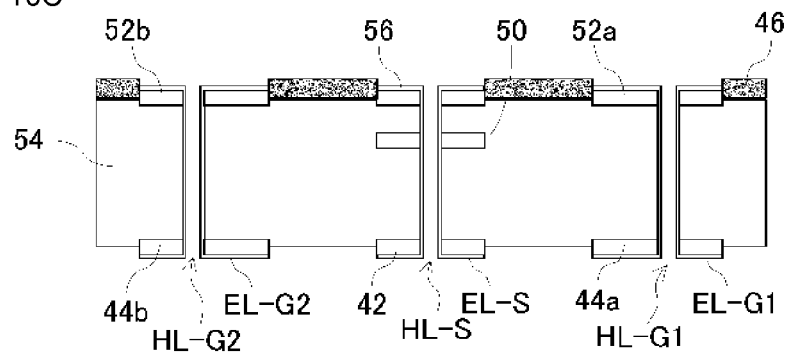
FIG. 10C is a diagram illustrating another step of the manufacturing process of the high-frequency transmission line.

The high-frequency transmission line 40 is formed preferably by a process illustrated in FIGS. 10A to 10C. First, the high-frequency transmission line 40 in which the through holes HL-S, HL-G1, and HL-G2 are not yet formed is prepared (see FIG. 10A). Next, the through holes HL-S, HL-G1, and HL-G2 are formed (see FIG. 10B). The through hole HL-S extends through the resist layer 46, the reinforcing layer 56, the linear conductor 50, and the signal terminal 42. The through hole HL-G1 extends through the resist layer 46, the linear conductor 52a, and the ground terminal 44a. The through hole HL-G2 extends through the resist layer 46, the linear conductor 52b, and the ground terminal 44b.

Next, the conductive film EL-S is formed on the inner peripheral surface of the through hole HL-S and in regions around both ends of the through hole HL-S. In addition, the conductive film EL-G1 is formed on the inner peripheral surface of the through hole HL-G1 and in regions around both ends of the through hole HL-G1, and the conductive film EL-G2 is formed on the inner peripheral surface of the through hole HL-G2 and in regions around both ends of the through hole HL-G2 (see FIG. 10C).

As is clear from the above description, the high-frequency transmission line 40 includes the insulator 54 as a base material, and also includes the linear conductor 50 configured to transmit signals and the ground layers 44 and 52. The through hole HL-S is located at a position corresponding to the position of the linear conductor 50. The through holes HL-G1 and HL-G2 are located at positions corresponding to the positions of the linear conductors 52a and 52b of the ground layer 52.

The high-frequency transmission line 40 is arranged on the insulator 36 such that the positions of the bottom ends of the through holes HL-S, HL-G1, and HL-G2 are respectively aligned with the positions of the signal terminals 22, two ground terminals 24a, and 24b provided on the connector 36. The conductive bonding material PS1 provided at the top ends of the through holes HL-S, HL-G1, and HL-G2 is fluidized when heat is applied thereto, and flows to the bottom ends of the through holes HL-S, HL-G1, and HL-G2 due to surface tension or capillarity. The linear conductors 50, 52a, and 52b are electrically connected to the signal terminal 22, 24a, and 24b, respectively. Thus, a reliable connection structure is established by a simple process.

The conductive bonding material PS1 may be printed on the top-surface-side end portions of the through holes HL-S, HL-G1, and HL-G2 after the step illustrated in FIG. 10C.

Figure 11A:
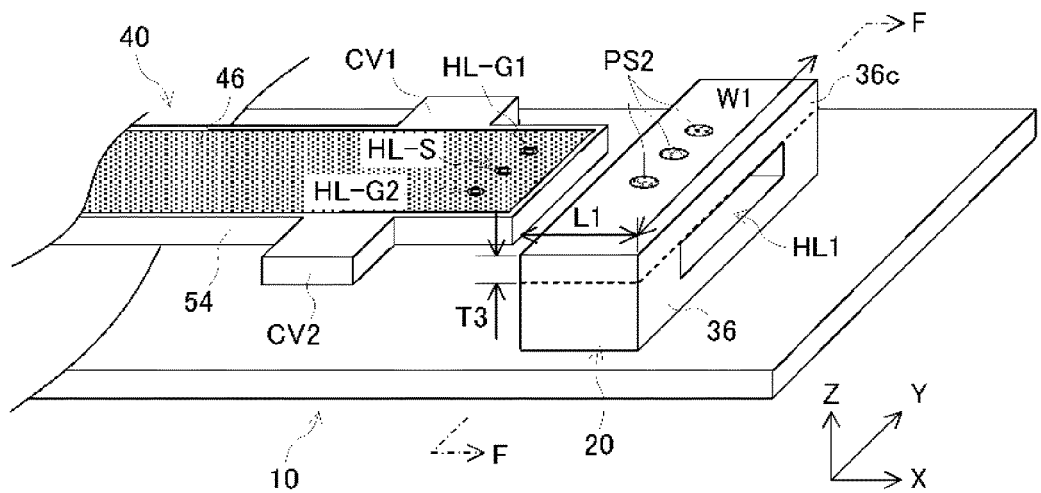
FIG. 11A is a diagram illustrating a step of a process of fixing a high-frequency transmission line to a printed wiring board according to another preferred embodiment of the present invention.
Figure 11B:
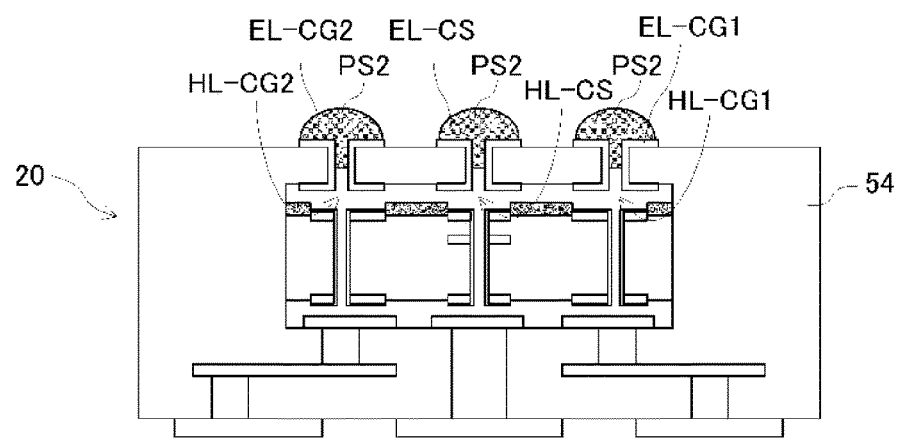
FIG. 11B is a sectional view of FIG. 11A taken along line F-F.

Referring to FIGS. 11A and 11B, a guide member 20 according to another preferred embodiment is structured such that a plate-shaped insulator (dielectric) having rectangular or substantially rectangular top and bottom surfaces is provided on an upper portion of the insulator 36 illustrated in FIGS. 2A and 2B. The insulator 36c has the length L1 in the X-axis direction, the width W1 in the Y-axis direction, and a thickness T3 in the Z-axis direction, and is stacked on the insulator 36 such that the side surfaces of the insulator 36c are flush with the side surfaces of the insulator 36. Accordingly, a through hole HL1, whose size corresponds to the size of the recess DT1 illustrated in FIGS. 2A and 2B, is formed in the guide member 20.

Through holes HL-CS, HL-CG1, and HL-CG2, which are arranged in the Y-axis direction, are formed in the top surface of the insulator 36c so as to extend to the bottom surface of the insulator 36c. A conductive film EL-CS is arranged around the end portions of the through hole HL-CS and on the inner peripheral surface of the through hole HL-CS. A conductive film EL-CG1 is arranged around the end portions of the through hole HL-CG1 and on the inner peripheral surface of the through hole HL-CG1. A conductive film EL-CG2 is arranged around the end portions of the through hole HL-CG2 and on the inner peripheral surface of the through hole HL-CG2.

When an end portion of the high-frequency transmission line 40 is fitted to the through hole HL1, the bottom end of the through hole HL-CS faces the top end of the through hole HL-S, the bottom end of the through hole HL-CG1 faces the top end of the through hole HL-G1, and the bottom end of the through hole HL-CG2 faces the top end of the through hole HL-G2. A conductive bonding material PS2, such as solder paste, is provided at the top ends of the through holes HL-CS, HL-CG1, and HL-CG2, and the above-described conductive bonding material PS1 is omitted.

The projections CV1 and CV2 provided on the high-frequency transmission line 40 engage with the insulator 36 of the guide member 20 so that the high-frequency transmission line 40 and the guide member 20 are positioned relative to each other. More specifically, the side surfaces of the projections CV1 and CV2 in the positive X-axis direction are brought into contact with the side surface of the insulator 36 in the negative X-axis direction. As a result, the signal terminal 42 and the ground terminals 44a and 44b provided on the high-frequency transmission line 40 respectively face the signal terminal 22 and the ground terminals 24a and 24b provided on the guide member 20.

Figure 12A:
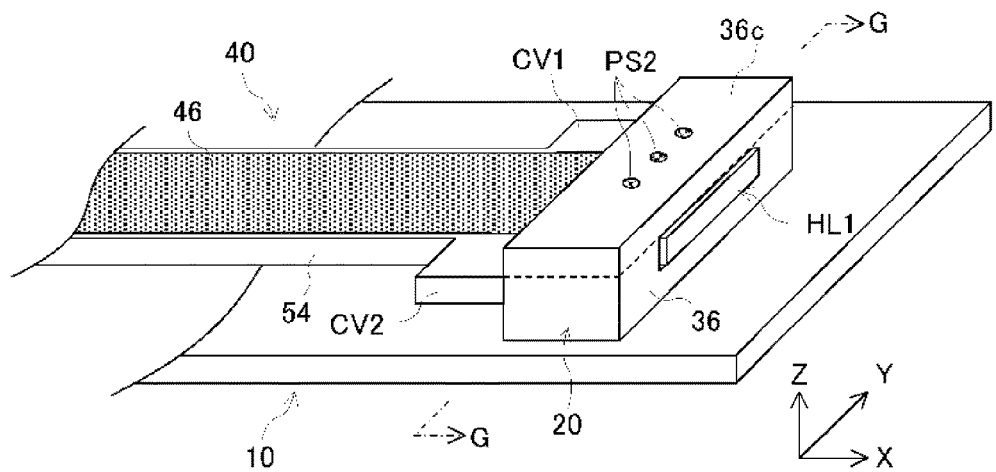
FIG. 12A is a diagram illustrating a step of a process of fixing a high-frequency transmission line to a printed wiring board according to another preferred embodiment of the present invention.
Figure 12B:
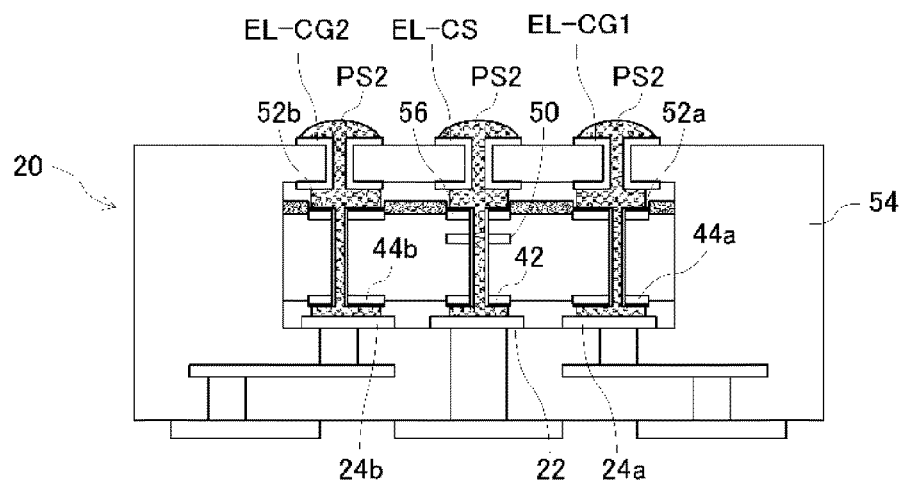
FIG. 12B is a sectional view of FIG. 12A taken along line G-G.

When the guide member 20 is heated in this state, the conductive bonding material PS2 is melted. The melted conductive bonding material PS2 flows to the bottom ends of the through holes HL-CS, HL-CG1, and HL-CG2 due to surface tension or capillarity, and further flows through the through holes HL-S, HL-G1, and HL-G2 to the signal terminal 22 and the ground terminals 24a and 24b. As a result, as illustrated in FIGS. 12A and 12B, the reinforcing layer 56, the linear conductor 50, and the signal terminal 42 are connected to the signal terminal 22, the linear conductor 52a and the ground terminal 44a to the ground terminal 24a, and the linear conductor 52b and the ground terminal 44b to the ground terminal 24b.

Figure 13A:
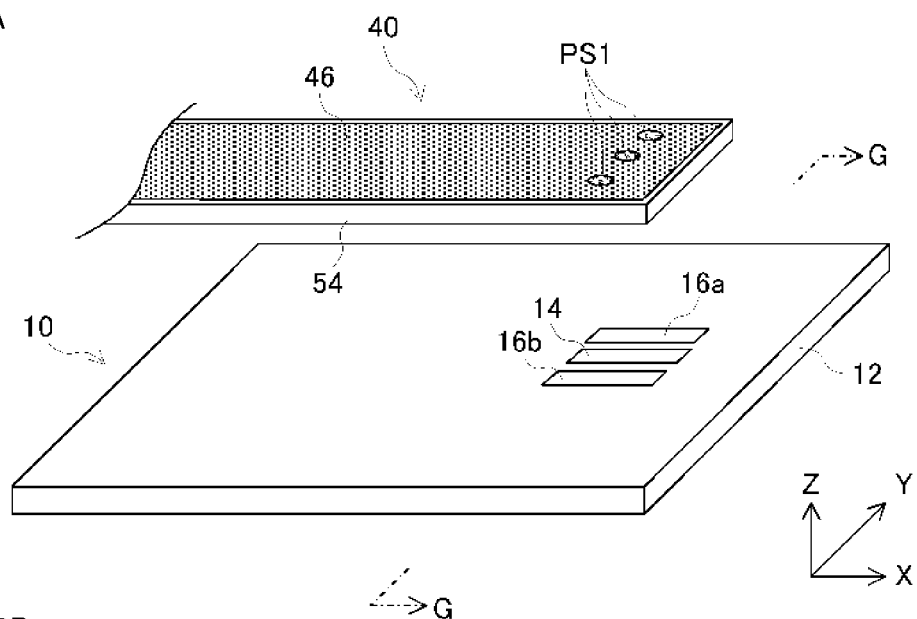
FIG. 13A is a diagram illustrating a step of a process of fixing a high-frequency transmission line to a printed wiring board according to another preferred embodiment of the present invention.
Figure 13B:
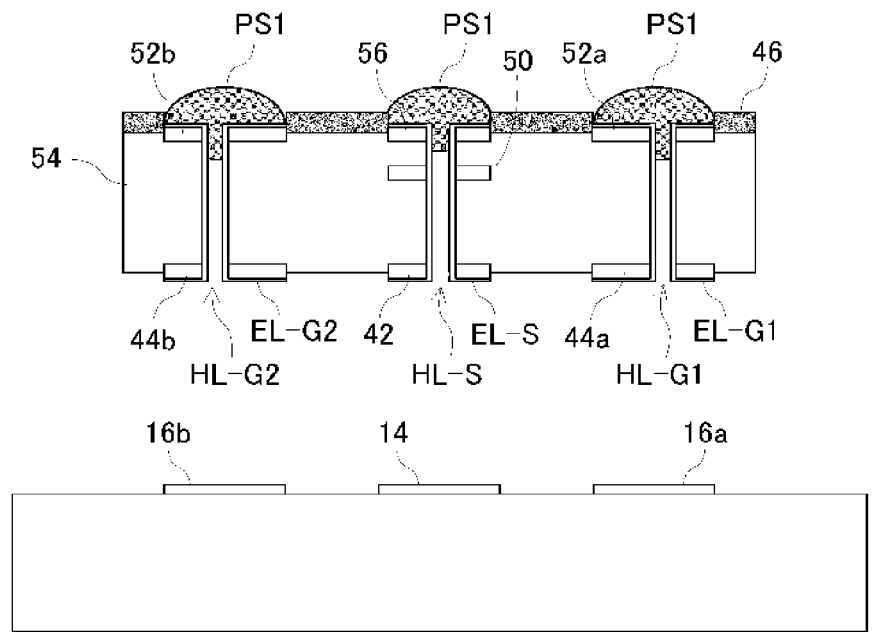
FIG. 13B is a sectional view of FIG. 13A taken along line H-H.

Referring to FIGS. 13A and 13B, according to another preferred embodiment of the present invention, the guide member 20 is omitted and the high-frequency transmission line 40 is directly mounted on the printed wiring board 10. The high-frequency transmission line 20 is arranged on the printed wiring board 10 such that the bottom ends of the through holes HL-S, HL-G1, and HL-G2 respectively face the signal terminal 14 and the ground terminals 16a and 16b provided on the wiring substrate 12.

Figure 14A:
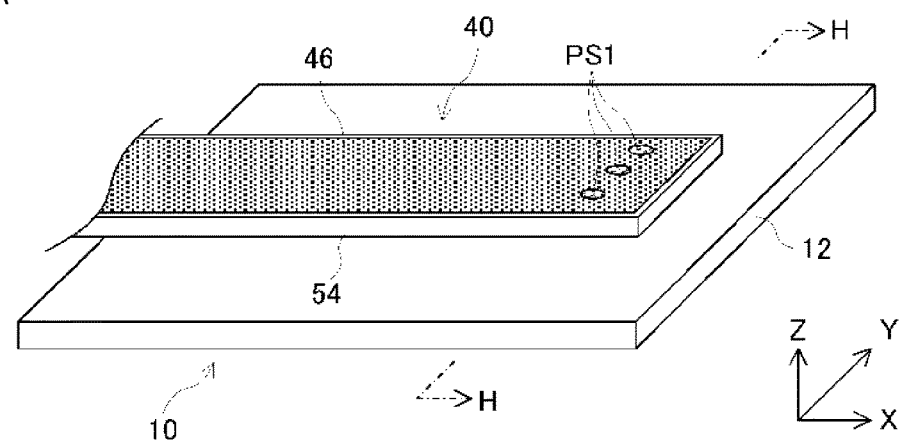
FIG. 14A is a diagram illustrating a step of a process of fixing a high-frequency transmission line to a printed wiring board according to another preferred embodiment of the present invention.
Figure 14B:
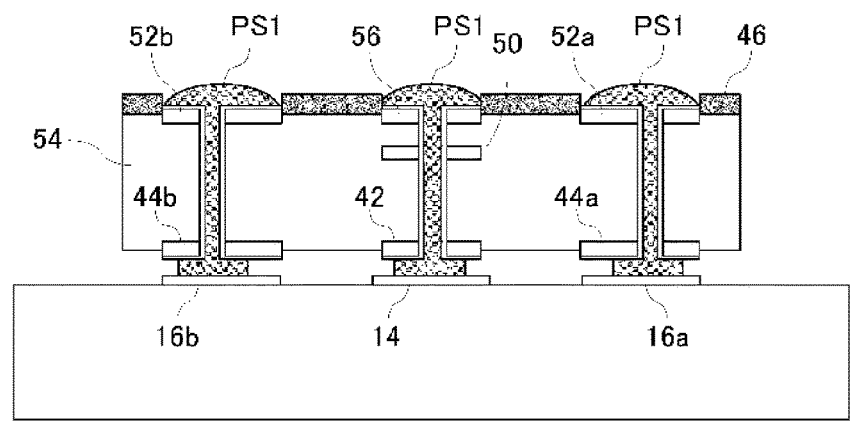
FIG. 14B is a sectional view of FIG. 14A taken along line I-I.

In this state, the conductive bonding material PS1 is printed on the top-surface-side end portions of the through holes HL-S, HL-G1, and HL-G2, and the high-frequency transmission line 40 is heated after the printing process. Accordingly, the conductive bonding material PS1 is melted and flows to the bottom ends of the through holes HL-S, HL-G1, and HL-G2 due to surface tension or capillarity. As a result, as illustrated in FIGS. 14A and 14B, the reinforcing layer 56, the linear conductor 50, and the signal terminal 42 are connected to the signal terminal 14, the linear conductor 52a and the ground terminal 44a to the ground terminal 16a, and the linear conductor 52b and the ground terminal 44b to the ground terminal 16b.

Figure 15A:
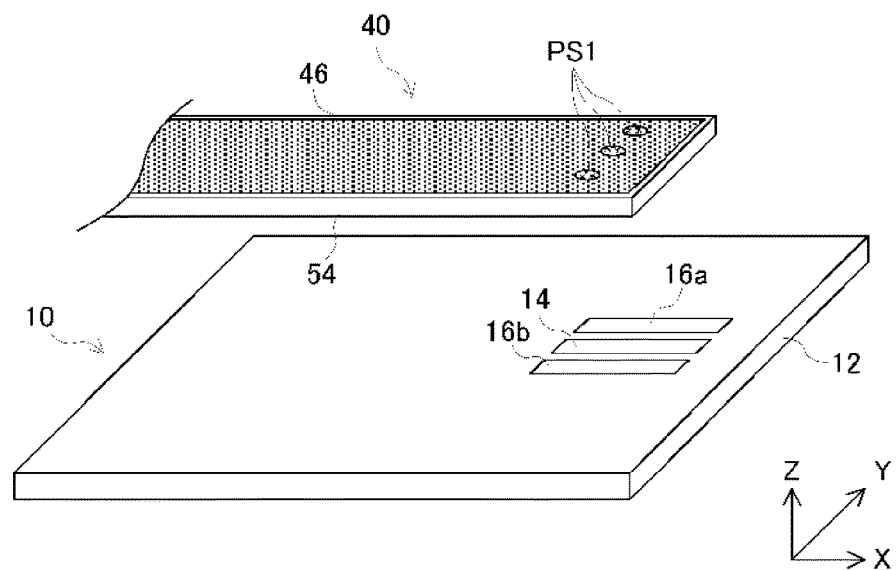
FIG. 15A is a diagram illustrating a step of a process of fixing a high-frequency transmission line to a printed wiring board according to another preferred embodiment of the present invention.
Figure 15B:
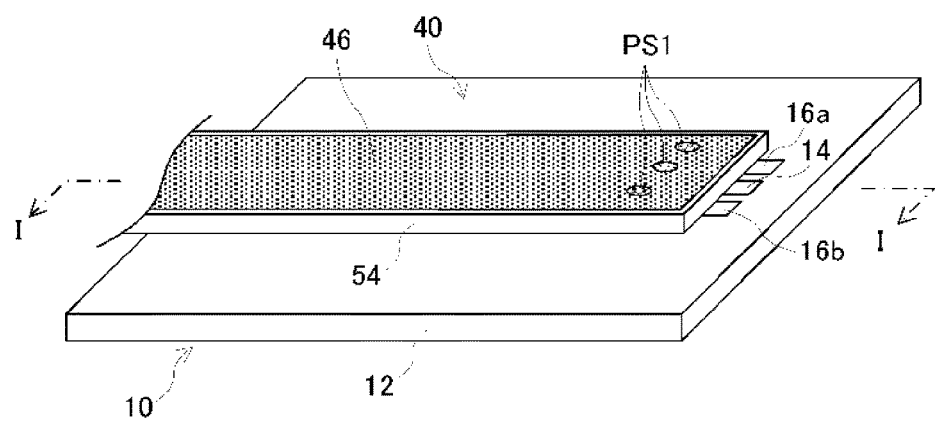
FIG. 15B is a sectional view of FIG. 15A taken along line J-J.

Referring to FIGS. 15A and 15B, according to another preferred embodiment of the present invention, the guide member 20 is omitted, and the lengths of the signal terminal 14 and the ground terminals 16a and 16b provided on the printed wiring board 10 are increased in the positive X-axis direction. The high-frequency transmission line 40 is directly mounted on the printed wiring board 10. The signal terminal 14 and the ground terminals 16a and 16b are partially exposed after the high-frequency transmission line 20 is mounted.

The high-frequency transmission line 20 is arranged on the printed wiring board 10 such that the bottom ends of the through holes HL-S, HL-G1, and HL-G2 respectively face the signal terminal 14 and the ground terminals 16a and 16b provided on the wiring substrate 12.

In this state, the conductive bonding material PS1 is printed on the top-surface-side end portions of the through holes HL-S, HL-G1, and HL-G2, and the high-frequency transmission line 40 is heated after the printing process. Accordingly, the conductive bonding material PS1 is melted and flows to the bottom ends of the through holes HL-S, HL-G1, and HL-G2 due to surface tension or capillarity. The conductive bonding material PS1 that has flowed to the bottom ends flows along the top surfaces of the signal terminal 14 and the ground terminals 16a and 16b in the length direction and becomes exposed at the end portion of the high-frequency transmission line 40 in the X-axis direction (see FIG. 16).

By visually checking the exposed conductive bonding material PS1, that is, through an appearance inspection, it can be confirmed that the reinforcing layer 56, the linear conductor 50, and the signal terminal 42 are connected to the signal terminal 14, the linear conductor 52a and the ground terminal 44a are connected to the ground terminal 16a, and the linear conductor 52b and the ground terminal 44b are connected to the ground terminal 16b.

Figure 17:
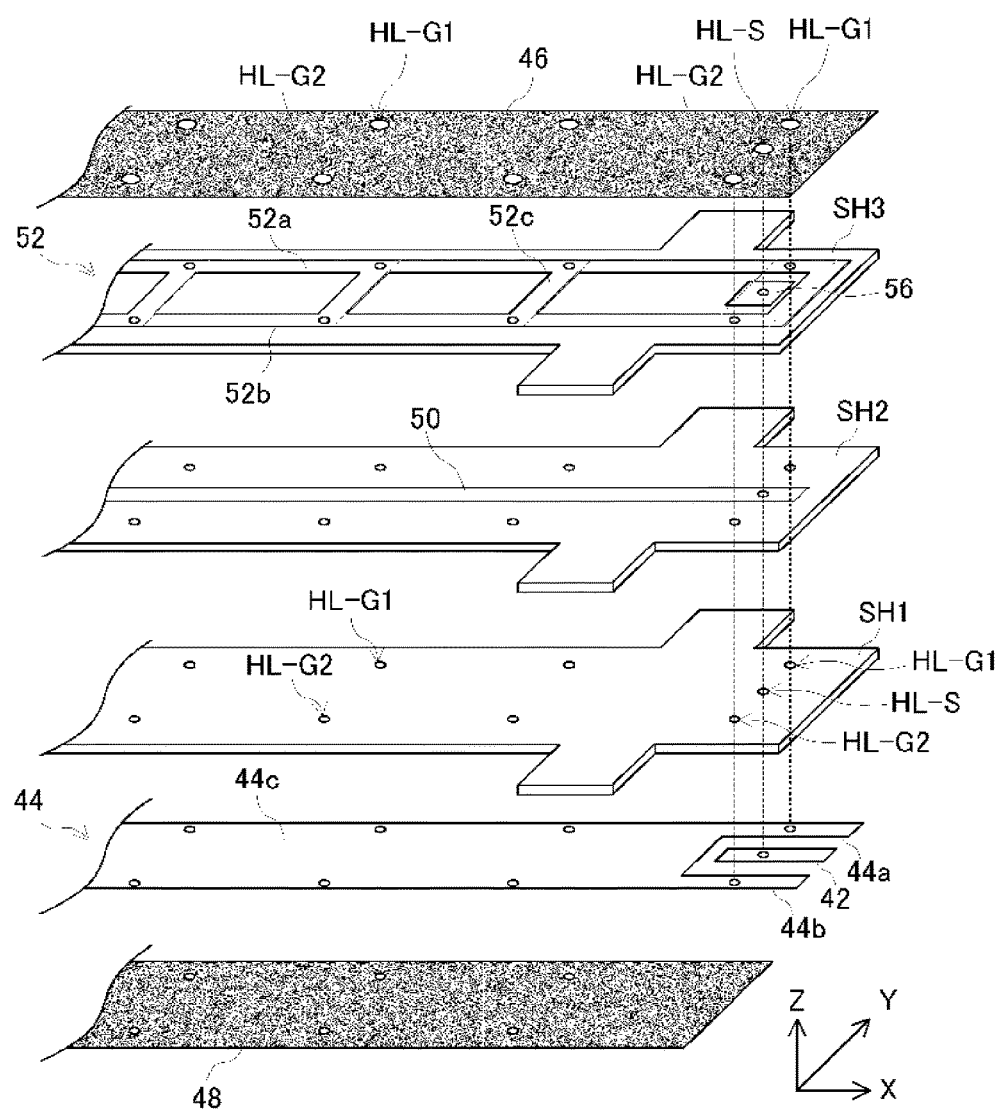
FIG. 17 is an exploded perspective view illustrating an example of a state in which a high-frequency transmission line according to another preferred embodiment of the present invention is disassembled.

Referring to FIG. 17, according to another preferred embodiment of the present invention, the high-frequency transmission line 40 includes through holes HL-G1 and HL-G2 arranged along the X-axis with constant intervals therebetween. The through holes HL-G1 extend through the linear conductor 52a of the ground layer 52, and the through holes HL-G2 extend through the linear conductor 52b of the ground layer 52. Similar to the above-described preferred embodiments, conductive films EL-G1 are arranged around the end portions of the through holes HL-G1 and on the inner peripheral surfaces of the through holes HL-G1, and conductive films EL-G2 are arranged around the end portions of the through holes HL-G2 and on the inner peripheral surfaces of the through holes HL-G2.

Figure 18A:
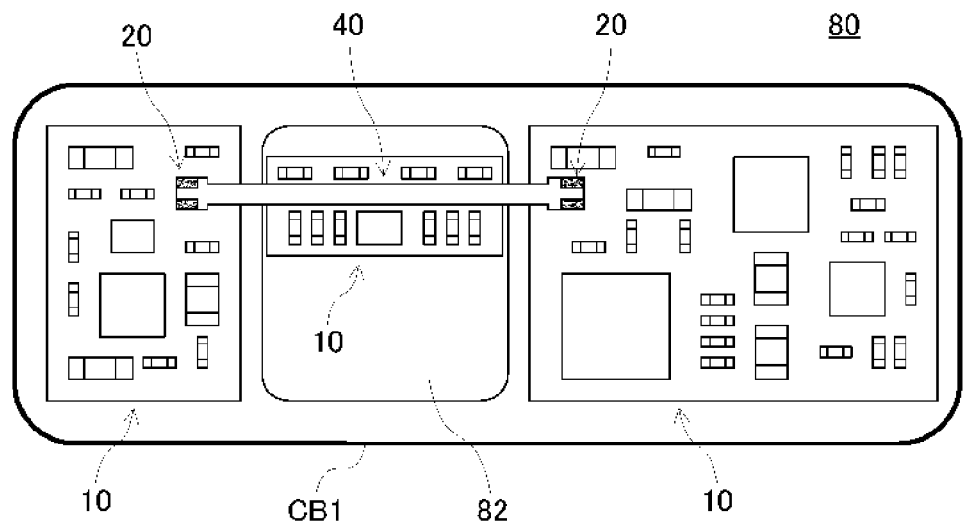
FIG. 18A is a top view of an example of a mobile communication terminal including the high-frequency transmission line illustrated in FIG. 17, guide members, and printed wiring boards.
Figure 18B:
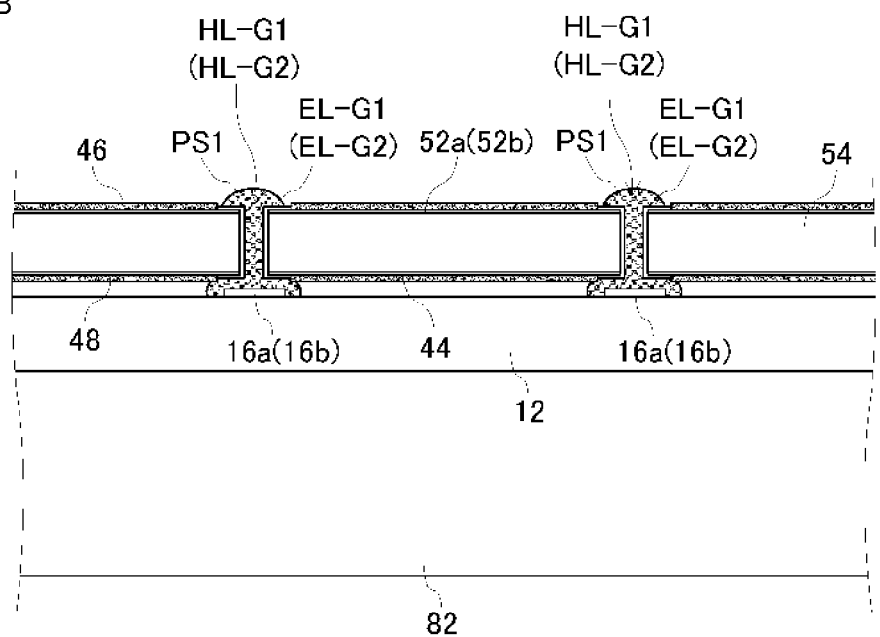
FIG. 18B is a sectional view of a main portion of the communication terminal illustrated in FIG. 18A.

As illustrated in FIGS. 18A and 18B, printed wiring boards 10 on which guide members 20 are mounted are housed in, for example, a housing CB1 of a mobile communication terminal 80. The high-frequency transmission line 40 is mounted on the printed wiring boards 10 in the above-described manner. One of the printed wiring boards 10 is disposed under a central portion of the high-frequency transmission line 40 in the length direction. The through holes HL-G1 and HL-G2, which are arranged with constant intervals therebetween, are arranged so as to face ground terminals 16a and 16b provided on the printed wiring board 10 disposed under the high-frequency transmission line 40.

In this state, the conductive bonding material PS1 is printed on the top-surface-side end portions of the through holes HL-G1, and HL-G2, and the high-frequency transmission line 40 is heated after the printing process. Accordingly, the conductive bonding material PS1 is melted and flows to the bottom ends of the through holes HL-G1, and HL-G2 due to surface tension or capillarity. As a result, the linear conductor 52a and the ground terminal 44a are connected to the ground terminal 16a, and the linear conductor 52b and the ground terminal 44b are connected to the ground terminal 16b.

Each of the above-described insulators 36 and 54 is preferably made of a flexible thermoplastic resin, such as polyimide or liquid crystal polymer. The insulation sheets SH1 to SH3 formed of a thermoplastic resin generates gas in the thermocompression bonding process. Therefore, a plurality of small holes may be formed in the ground layer 44 to release the generated gas.

The signal terminals 14, 22, 26, and 42, the ground terminals 16a, 16b, 24a, and 24b, the ground layers 44 and 52, and the linear conductor 50 may be formed of a metal material, preferably a metal foil, containing silver or copper as a main component and having a low specific resistance.

The thickness of the insulator 54 included in the high-frequency transmission line 40 is adjusted so as to be in the range of about 100 μm to about 300 μm, and is preferably about 200 μm, for example. The line width of the linear conductor 50 included in the high-frequency transmission line 40 is preferably adjusted so as to be in the range of about 100 μm to about 500 μm, and is preferably about 240 μm, for example. The line width of each of the linear conductors 52a to 52c of the ground layer 52 is adjusted so as to be in the range of about 25 μm to about 200 μm, and is preferably about 100 μm, for example. The distance between the linear conductors 52c is adjusted so as to be in the range of about 1000 μm to about 10000 μm, and is preferably about 2500 μm, for example. The size of the guide member 20 is adjusted so as to match the size of the high-frequency transmission line 40.

Figure 16:
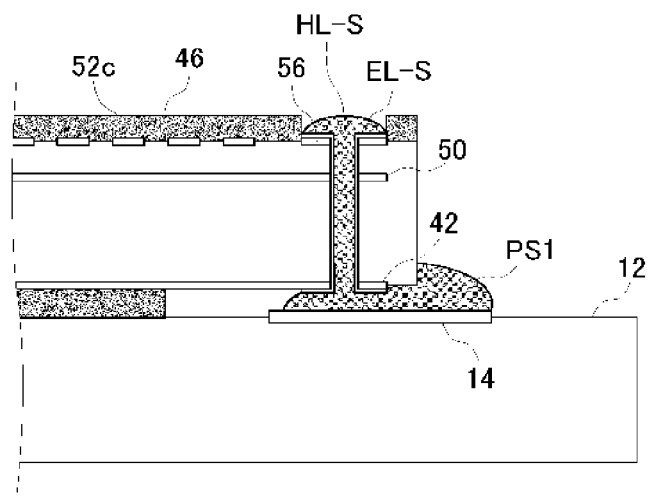
FIG. 16 is a diagram illustrating another step of the process of fixing the high-frequency transmission line to the printed wiring board according to a preferred embodiment of the present invention.

In all of the above-described preferred embodiments, the signal terminal 42 and the ground terminals 44a to 44b provided on the high-frequency transmission line 40 are respectively connected to the signal terminal 14 and the ground terminals 16a to 16b provided on the printed wiring board 10 in a vertical direction by a conductive bonding material (see, for example FIG. 16). Therefore, when the high-frequency transmission line 40 is designed to show a characteristic impedance of about 50Ω and the inner pattern, the signal terminal 14, and the ground terminals 16a to 16b provided on the printed wiring board 10 are designed as about 50Ω series, for example, disturbance in TEM waves formed by the linear conductor 50 and the ground layers 44 and 52 is reduced and signal loss is reduced accordingly.

Referring to, for example, FIG. 16, a portion of the conductive bonding material that extends from the linear conductor 50 to the reinforcing layer 56 in the high-frequency transmission line 40 defines and functions as an open stub. However, in all of the above-described preferred embodiments, the linear conductor 50 is located near the reinforcing layer 56 in the Z-axis direction. In other words, when the high-frequency transmission line 40 is mounted on the printed wiring board 10, the distance from the reinforcing layer 56 to the linear conductor 50 is smaller than the distance from the top surface of the printed wiring board 10 to the linear conductor 50. Therefore, degradation of the frequency characteristics of the high-frequency transmission line 40 is significantly reduced or prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A connecting-and-fixing method for a cable, the method comprising:
   a first step of preparing a high-frequency transmission line including a linear conductor that is disposed in an insulating base material and that includes a signal conductor to which a signal voltage is applied, the base material having a through hole at a position corresponding to a position of the linear conductor;
   a second step of placing the high-frequency transmission line on a substrate in a state in which a position of a first end of the through hole is aligned with a position of a substrate terminal provided on the substrate; and
   a third step of fluidizing a conductive bonding material applied to a second end of the through hole and causing the conductive bonding material to flow through the through hole to the first end of the through hole to electrically connect the linear conductor disposed in the insulating material and including the signal conductor to the substrate terminal; wherein
   in the second step, the high-frequency transmission line is positioned by being fitted to a guide member provided on the substrate; and
   in the third step, the conductive bonding material is applied from the second end of the through hole to the first end of the through hole.

2. The connecting-and-fixing method according to claim 1, wherein a metal film is formed on an inner peripheral surface of the through hole.

3. The connecting-and-fixing method according to claim 1, wherein a metal film is formed around the first end and the second end of the through hole.

4. The connecting-and-fixing method according to claim 1, wherein the substrate terminal is provided on the guide member.

5. The connecting-and-fixing method according to claim 1, wherein
   the linear conductor further includes a ground conductor to which a ground voltage is applied; and
   the substrate terminal includes a signal terminal connected to the signal conductor and a ground terminal connected to the ground conductor.

6. The connecting-and-fixing method according to claim 1, wherein the insulating base material includes a resist layer formed thereon.

7. The connecting-and-fixing method according to claim 1, wherein a first resist layer is disposed on a top surface of the insulating base material and a second resist layer is disposed on a bottom surface of the insulating base material.

8. The connecting-and-fixing method according to claim 1, wherein a single signal terminal and two ground terminals are provided on the insulating base material.

9. The connecting-and-fixing method according to claim 8, wherein the insulating base material includes through holes each extending through a respective one of the single signal terminal and the two ground terminals.

10. The connecting-and-fixing method according to claim 1, wherein the insulating base material includes projections protruding from side surfaces thereof.

11. The connecting-and-fixing method according to claim 1, wherein the conductive bonding material is solder paste.

12. The connecting-and-fixing method according to claim 1, wherein a conductive film is formed in the through hole.

13. The connecting-and-fixing method according to claim 1, wherein the insulating base material includes linear conductors defining a ground layer.

14. The connecting-and-fixing method according to claim 13, wherein the insulating base material includes through holes at locations of the linear conductors defining the ground layer.

15. The connecting-and-fixing method according to claim 1, wherein a conductive film surrounds the through hole.

\* \* \* \* \*